(12) United States Patent
Jung (10) Patent No.: US 7,892,977 B2
(45) Date of Patent: Feb. 22, 2011

(54) HARD MASK PATTERNS OF A SEMICONDUCTOR DEVICE AND A METHOD FOR FORMING THE SAME

(75) Inventor: Woo Yung Jung, Seoul (KR)

(73) Assignee: Hynix Semiconductor Inc., Icheon-si (KR)

( * ) Notice: Subject to any disclaimer, the term of this patent is extended or adjusted under 35 U.S.C. 154(b) by 377 days.

(21) Appl. No.: 12/054,319

(22) Filed: Mar. 24, 2008

(65) Prior Publication Data

US 2009/0140398 A1    Jun. 4, 2009

(30) Foreign Application Priority Data

Nov. 29, 2007   (KR) ...................... 10-2007-0122647

(51) Int. Cl.
*H01L 21/311*   (2006.01)
(52) U.S. Cl. .............................. 438/694; 257/E21.305; 438/717; 438/736; 438/942; 438/950; 716/19
(58) Field of Classification Search ........... 257/E21.305; 438/694, 717, 736, 942, 950; 716/19
See application file for complete search history.

(56) References Cited

U.S. PATENT DOCUMENTS

| 2008/0113511 A1* | 5/2008 | Park et al. .................... 438/692 |
| 2009/0271758 A1* | 10/2009 | Wells .......................... 716/19 |

FOREIGN PATENT DOCUMENTS

| KR | 1020040104417 A | 12/2004 |
| KR | 100734464 B1 | 6/2007 |

* cited by examiner

*Primary Examiner*—Asok K Sarkar
(74) *Attorney, Agent, or Firm*—Kilpatrick Townsend & Stockton LLP (57) ABSTRACT

In a method for forming hard mask patterns of a semiconductor device first hard mask patterns are formed on a semiconductor substrate. Second hard mask patterns are formed and include first patterns which are substantially perpendicular to the first hard mask patterns and second patterns which are positioned between the first hard mask patterns. Third hard mask patterns are formed between the first patterns.

28 Claims, 11 Drawing Sheets

HARD MASK PATTERNS OF A SEMICONDUCTOR DEVICE AND A METHOD FOR FORMING THE SAME

CROSS-REFERENCES TO RELATED APPLICATIONS

The present application claims priority to Korean patent application number 10-2007-122647, filed on Nov. 29, 2007, which is incorporated by reference in its entirety.

BACKGROUND OF THE INVENTION

The present invention relates to hard mask patterns of a semiconductor device and a method for forming the same, and more particularly, to hard mask patterns of a semiconductor device, which can be used when implementing an etching process for defining a plurality of contact holes to be arranged in the shape of a matrix, and a method for forming the same.

A plurality of semiconductor elements such as transistors are formed in a semiconductor substrate, and metal lines are formed to electrically connect the semiconductor elements. The metal lines and the junction areas (for example, the source or drain areas of the transistors) of the semiconductor substrate are electrically connected by contact plugs.

In the case of a DRAM (dynamic random access memory) device, transistors and storage node contact plugs are formed in a semiconductor substrate. Contact holes are defined in an interlayer dielectric before forming the contact plugs. DRAM devices are categorized depending upon the arrangement of transistors and capacitors. In a 4F4 DRAM device, storage node contact plugs are arranged in the shape of a matrix in a cell region. After transistors are formed, an interlayer dielectric is formed, and a plurality of contact holes are defined in the interlayer dielectric in a cell region and are arranged in the shape of a matrix. As the integration level of a semiconductor device increases, the arrangement of the contact holes in the 4F4 DRAM device has a pitch less than the resolution limit of exposure equipment. Thus, when forming a photoresist pattern for defining the areas in which contact holes are to be defined, a photolithographic process must be implemented twice for a photoresist layer. As a result, processing costs increase. Furthermore, it is difficult to decrease a resolution index (k1) below 0.20.

SUMMARY OF THE INVENTION

An embodiment of the present invention is directed to hard mask patterns of a semiconductor device and a method for forming the same, wherein only line type patterning processes are implemented in longitudinal and transverse directions on a plane such that hard mask patterns can be densely arranged to have a pitch less than a resolution limit of exposure equipment.

In one aspect, a method for forming hard mask patterns of a semiconductor device comprises the steps of forming first hard mask patterns on a semiconductor substrate; forming second hard mask patterns including first patterns which are substantially perpendicular to the first hard mask patterns and second patterns which are positioned between the first hard mask patterns; and forming third hard mask patterns between the first patterns.

In one aspect, a method for forming hard mask patterns of a semiconductor device comprises the steps of forming a first layer over a semiconductor substrate; patterning the first layer, thereby forming first hard mask patterns each of which has line shape, wherein a space is defined between the first hard mask patterns; forming a first auxiliary layer along surface of a resulting structure after forming the first hard mask patterns; forming a second layer over the first auxiliary layer; forming photoresist patterns each of which has a line shape over the second layer, wherein the photoresist patterns are perpendicular to the first hard mask patterns; removing the second layer exposed by the photoresist patterns to expose the first auxiliary layer and such that the second layer remains within the space between the first hard mask patterns, thereby forming a second hard mask pattern including first line portions perpendicular to the first hard mask patterns and second line portions which are positioned between the first hard mask patterns and are parallel to the first hard mask patterns, wherein a space is defined between the first line portions; removing the photoresist patterns; forming a second auxiliary layer along surface of a resulting structure after removing the photoresist patterns; forming a third layer over the second auxiliary layer; removing the third hard layer to expose the second auxiliary layer such that the third layer remains within the space between the first line portions, thereby forming third hard mask patterns parallel to the first line portions, wherein a space is defined between the third hard mask patterns; and removing the first and second auxiliary layers exposed by an overlap of the space between the third hard mask patterns and the space between the first line portions, thereby exposing contact areas arranged in a two-dimensional pattern.

Before forming the first layer, a lower layer can be formed on the semiconductor substrate. The first layer can be formed as a spin-on coating (SOC) layer. The first layer can be formed as a Si-containing bottom antireflective coating (BARC) layer.

The first auxiliary layer can be formed of carbon polymer. An anti-reflection layer can be additionally formed on the second layer. A distance between the first hard mask pattern and the second line portion of the second hard mask pattern is determined by a thickness of the first auxiliary layer. The second layer can be formed as a Si-containing BARC layer.

The second auxiliary layer can be formed of carbon polymer. A distance between the first line portion of the second hard mask pattern and the third hard mask pattern is determined by a thickness of the second auxiliary layer. The third layer can be formed as a Si-containing BARC layer.

It is preferred that the first, second and third hard mask patterns are formed of the same material, and the first, second and third hard mask patterns are formed on different layers from one another. The first and second patterns of the second hard mask patterns are formed on different layers from each other.

Spaces formed by the first, second and third hard mask patterns are defined as the contact areas in which contact holes are to be formed. A pitch of the first hard mask patterns is approximately two times a pitch of the contact areas. A pitch of the first line portions is approximately two times a pitch of the contact areas. A pitch of the second line portions of the second pattern is approximately two times a pitch of the contact areas. A pitch of the third hard mask patterns is approximately two times a pitch of the contact areas.

In another aspect, hard mask patterns of a semiconductor device comprise first hard mask patterns formed on a semiconductor substrate, wherein each of the first hard mask patterns has a line shape wherein a space is defined between the first hard mask patterns; a second hard mask pattern including first line portions perpendicular to the first hard mask patterns and second line portions which are positioned between the first hard mask patterns and are parallel to the first hard mask patterns, wherein a space is defined between the first line portions; and third hard mask patterns that are positioned between the first line portions and are parallel to the first line portions, wherein a space is defined between the third hard mask patterns, wherein contact areas arranged in a two-dimensional pattern are exposed by the first, second and third hard mask patterns.

The first, second and third hard mask patterns can be formed of the same material. For example, the first, second and third hard mask patterns can be formed as Si-containing BARC layers. The first, second and third hard mask patterns are formed on different layers from one another. The first and second patterns of the second hard mask patterns are formed on different layers from each other.

A lower layer and a hard layer can be formed on the semiconductor substrate, and the hard layer can be formed as an SOC (spin-on carbon) layer.

A distance between the second line portions of the second hard mask pattern and the first hard mask pattern corresponds to a transverse width of contact holes, and a distance between the first line portions of the second hard mask pattern and the third hard mask pattern corresponds to a longitudinal width of the contact holes. Distances between the first, second and third hard mask patterns can be substantially the same.

DESCRIPTION OF SPECIFIC EMBODIMENT

Reference will now be made in detail to a specific embodiment of the invention, an example of which is illustrated in the accompanying drawings. The embodiment of the present invention can be modified in a variety of ways. The scope of the present invention is not to be construed as being limited by the present embodiment. It is to be noted that the present embodiment is provided only to allow a person having ordinary knowledge in the art to better understand the present invention.

When it is mentioned that a layer is formed over another layer or a semiconductor substrate, it can be envisaged that the layer may be in direct contact with another layer or the semiconductor substrate, or a third layer may be interposed therebetween. It is to be noted that the thicknesses or the sizes of the respective layers shown in the drawings are exaggerated for the sake of convenience and clearness in explanation. The same reference numerals will be used throughout the drawings and the description to refer to the same or like parts.

FIGS. 1A through 1J are views illustrating a method for forming hard mask patterns of a semiconductor device in accordance with an embodiment of the present invention.

Figure 1A:
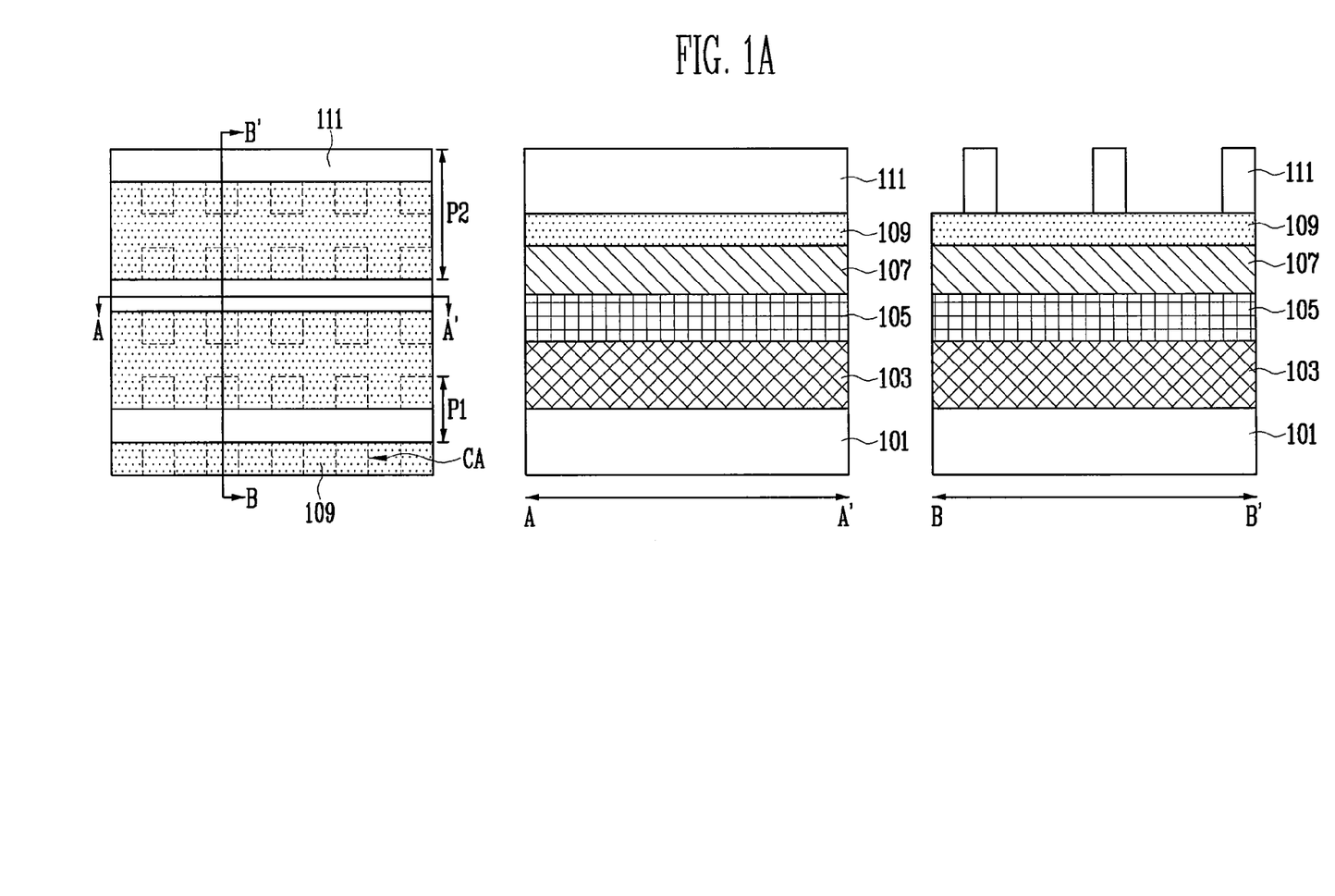
FIGS. 1A through 1J are views illustrating a method for forming hard mask patterns of a semiconductor device in accordance with an embodiment of the present invention.

Referring to FIG. 1A, a lower layer 103 is formed over a semiconductor substrate 101 which is formed with semiconductor elements (not shown) including transistors. The lower layer 103 may be an interlayer dielectric. A first hard layer 105, a second hard layer 107 and a first anti-reflection layer 109 are sequentially formed over the lower layer 103 to be used as an etch mask when implementing an etching process for defining a plurality of contact holes in the lower layer 103. First photoresist patterns 111 are formed over the first anti-reflection layer 109.

The contact holes are arranged in the shape of a matrix as will be exemplified below. The process for defining contact holes arranged in the shape of a matrix can also be applied in the same manner to a process for defining storage node contact holes in the manufacture of a DRAM.

The first hard layer 105 is formed as a spin-on coating (SOC) layer, and the second hard layer 107 is formed as a Si-containing BARC (bottom anti-reflective coating) layer. The first anti-reflection layer 109 prevents an exposure characteristic from being degraded due to scattered reflection while forming the first photoresist patterns 111. In the case where the second hard layer 107 can prevent the scattered reflection, the first anti-reflection layer 109 can be omitted.

The first photoresist patterns 111 are formed to be parallel to one another in one direction. Specifically, in the case of a DRAM device, the first photoresist patterns 111 that are formed between contact areas CA parallel to one another in one direction. Contact holes are defined in the contact areas CA in a cell region. The pitch P2 between the first photoresist patterns 111 is approximately two times the pitch P1 between the contact areas CA.

Figure 1B:
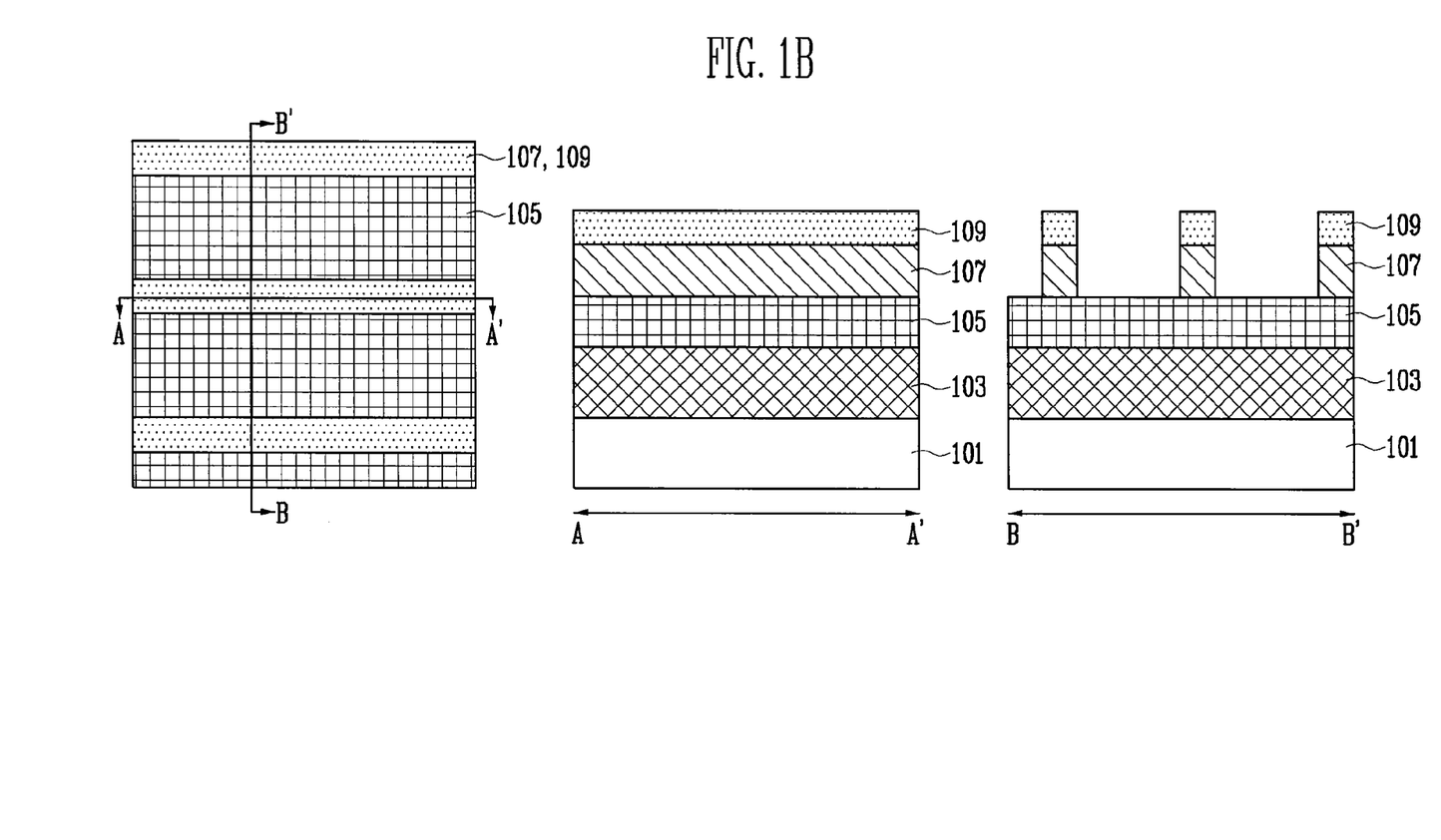

Referring to FIG. 1B, by patterning the first anti-reflection layer 109 and the second hard layer 107 through an etching process using the first photoresist patterns 111, second hard mask patterns 107 are formed. In conformity with the shapes of the first photoresist patterns 111, the second hard mask patterns 107 are also patterned to be parallel to one another between the contact areas CA in one direction. The pitch of the second hard mask patterns 107 is approximately two times the pitch P1 of the contact areas CA. Portions of the first hard layer 105 are exposed between the second hard mask patterns 107. The first photoresist patterns 111 are then removed.

Figure 1C:
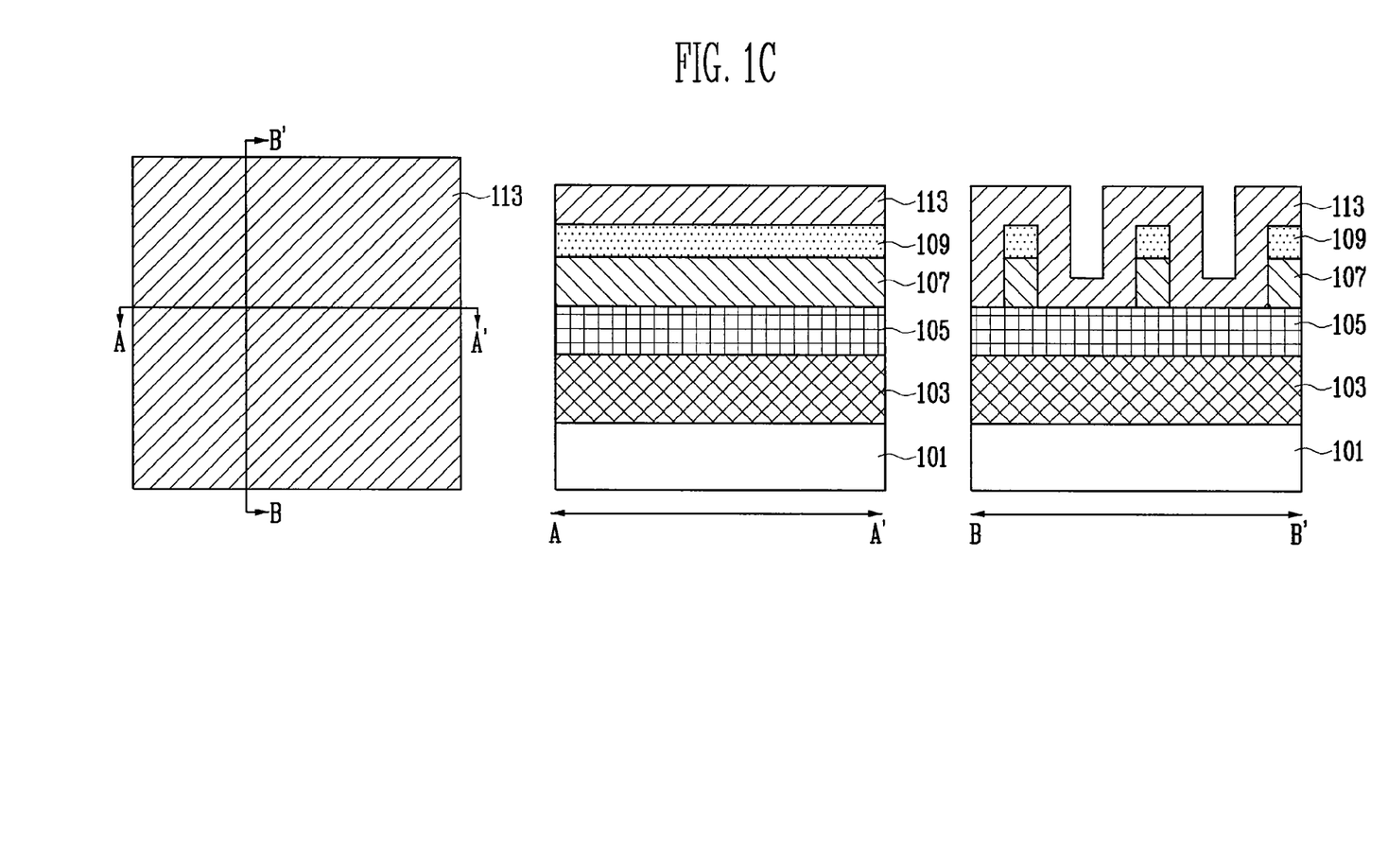

Referring to FIG. 1C, a first auxiliary layer 113 is formed over the exposed portions of the first hard layer 105 including the patterned first anti-reflection layer 109 and the second hard mask patterns 107. It is preferred that the first auxiliary layer 113 is formed of carbon polymer.

The first auxiliary layer 113 is formed to a thickness that allows the step portions formed by the second hard mask patterns 107 to be substantially maintained. In particular, since the thickness of the first auxiliary layer 113, which is formed on the sidewalls of the second hard mask patterns 107, determines the width of the contact holes in one direction in subsequent processes, it is preferred that the thickness of the first auxiliary layer 113 be adjusted depending upon the desired width of the contact holes in one direction. As the first auxiliary layer 113 is formed to a thickness that allows the step portions to be maintained, step portions, such as trenches, having a width corresponding to the distance between the contact areas CA, are formed between the second hard mask patterns 107 by the first auxiliary layer 113. In other words, the distance between the opposing sidewalls of the first auxiliary layer 113 corresponds to the distance between the contact holes.

Figure 1D:
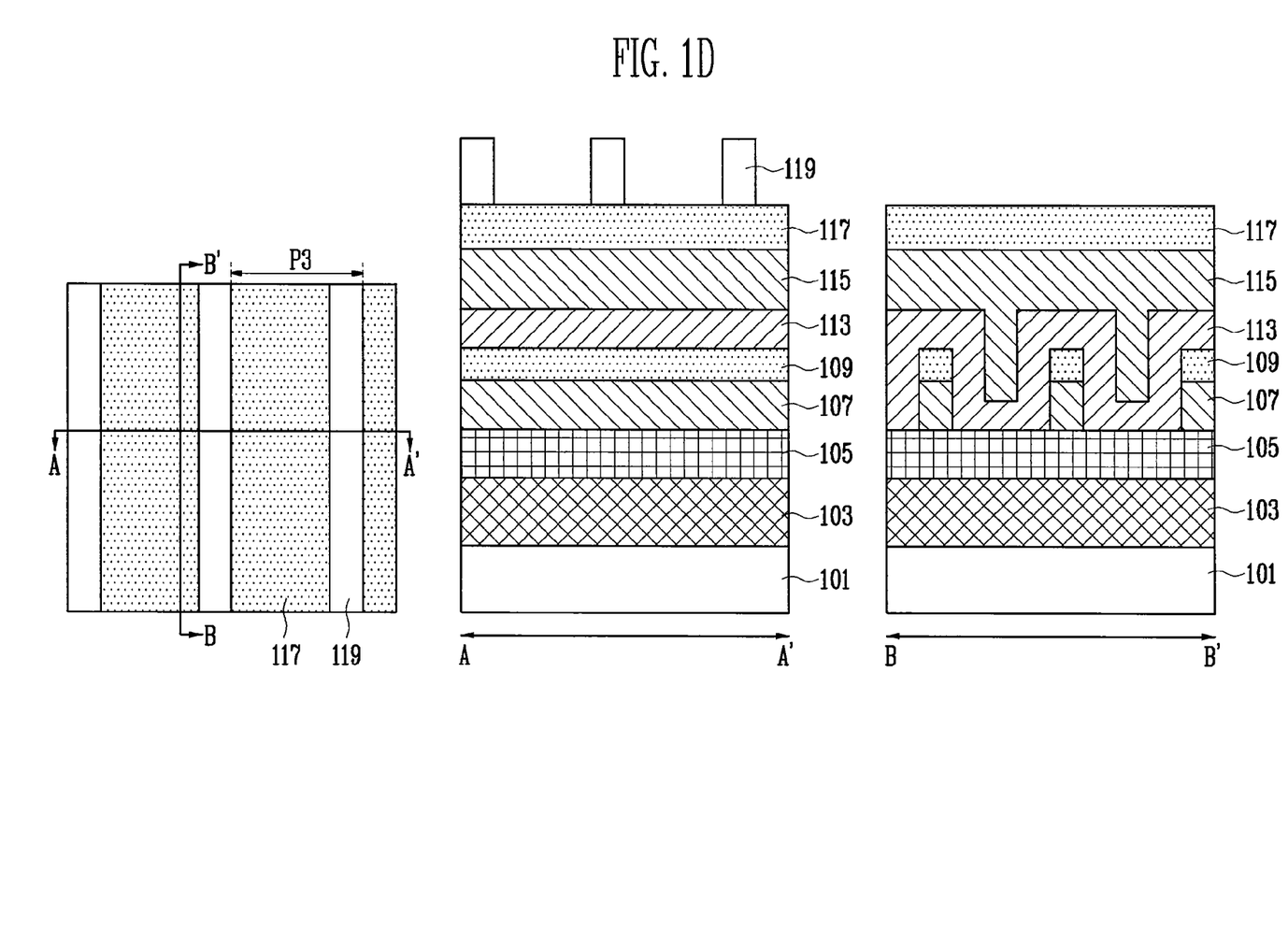

Referring to FIG. 1D, a third hard layer 115 is formed over the first auxiliary layer 113 such that the step portions defined in the first auxiliary layer 113 are filled. A second anti-reflection layer 117 is formed over the third hard layer 115. Second photoresist patterns 119 are formed over the second anti-reflection layer 117.

It is preferred that the third hard layer 115 be formed of the same material as the second hard mask patterns 107 to ensure easy implementation of subsequent processes. Namely, the third hard layer 115 can be formed of a Si-containing BARC layer. As described above with reference to FIG. 1A, in the case where the third hard layer 115 can prevent scattered reflection while implementing a photolithographic process for forming the second photoresist patterns 119, the second anti-reflection layer 117 can be omitted.

The second photoresist patterns 119 are formed parallel to one another in a direction that is substantially perpendicular to the first photoresist patterns 111 (see FIG. 1A). Specifically, in the case of a DRAM device, the second photoresist patterns 119 are formed parallel to one another between the contact areas CA, in which the contact holes are to be defined in a cell region, in a direction that is substantially perpendicular to the first photoresist patterns 111 (see FIG. 1A). The pitch P3 between the second photoresist patterns 119 is approximately two times the pitch P1 between the contact areas CA.

Figure 1E:
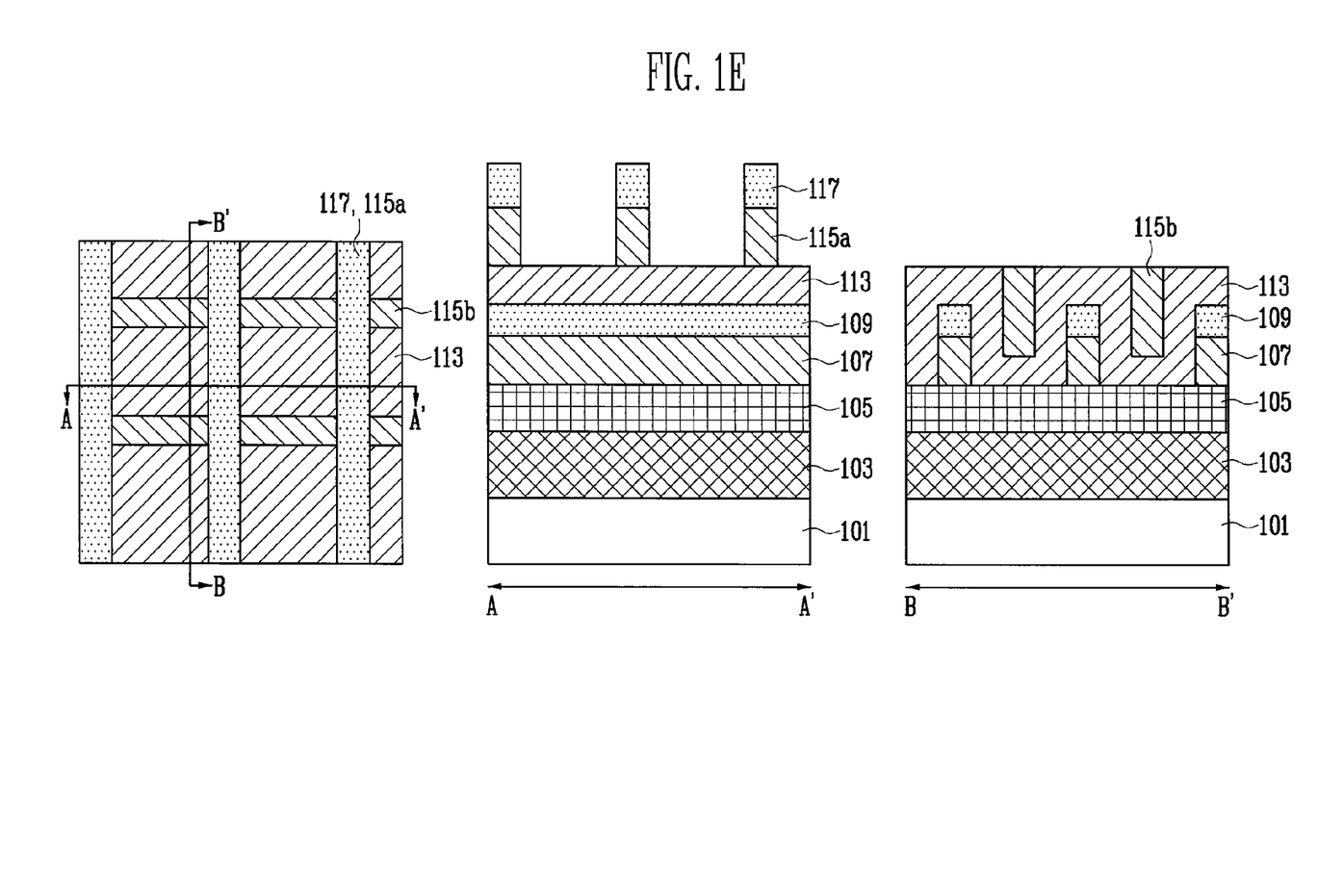

Referring to FIG. 1E, by patterning the second anti-reflection layer 117 and the third hard layer 115 through an etching process using the second photoresist patterns 119, third hard mask patterns 115a, 115b are formed. Thereafter, the second photoresist patterns 119 are removed.

The third hard mask patterns include first line portions 115a which are formed parallel to one another on the first auxiliary layer 113 in a direction that is substantially perpendicular to the second hard mask patterns 107 and second line portions 115b which are formed parallel to the second hard mask patterns 107 on the first auxiliary layer 113 between the second hard mask patterns 107. The distance between the second hard mask patterns 107 and the second line portions 115b is determined by the thickness of the first auxiliary layer 113.

Specifically, in conformity with the shapes of the second photoresist patterns 119, the third hard layer 115 is patterned on the first auxiliary layer 113 between the contact areas CA in a direction that is substantially perpendicular to the second hard mask patterns 107 such that the first line portions 115a extending parallel to one another are formed. The pitch of the first line portions 115a on the first auxiliary layer 113 is approximately two times the pitch P1 of the contact areas CA. Also, the third hard layer 115 remains in the step portions which are formed in the first auxiliary layer 113 between the second hard mask patterns 107 such that the second line portions 115b are formed. Since the second line portions 115b are arranged in the step portions formed in the first auxiliary layer 113 so that it is not necessary to use a separate mask, an arrangement error does not occur. The distance between the second line portions 115b and the second hard mask patterns 107 is determined by the thickness of the first auxiliary layer 113.

The third hard mask patterns include the first and second patterns line portions 115a, 115b, and expose the first auxiliary layer 113 in the shape of squares. Each of the exposed square regions of the first auxiliary layer 113 includes four contact areas CA. The four contact areas CA are respectively positioned in the four corners of each square region.

Figure 1F:
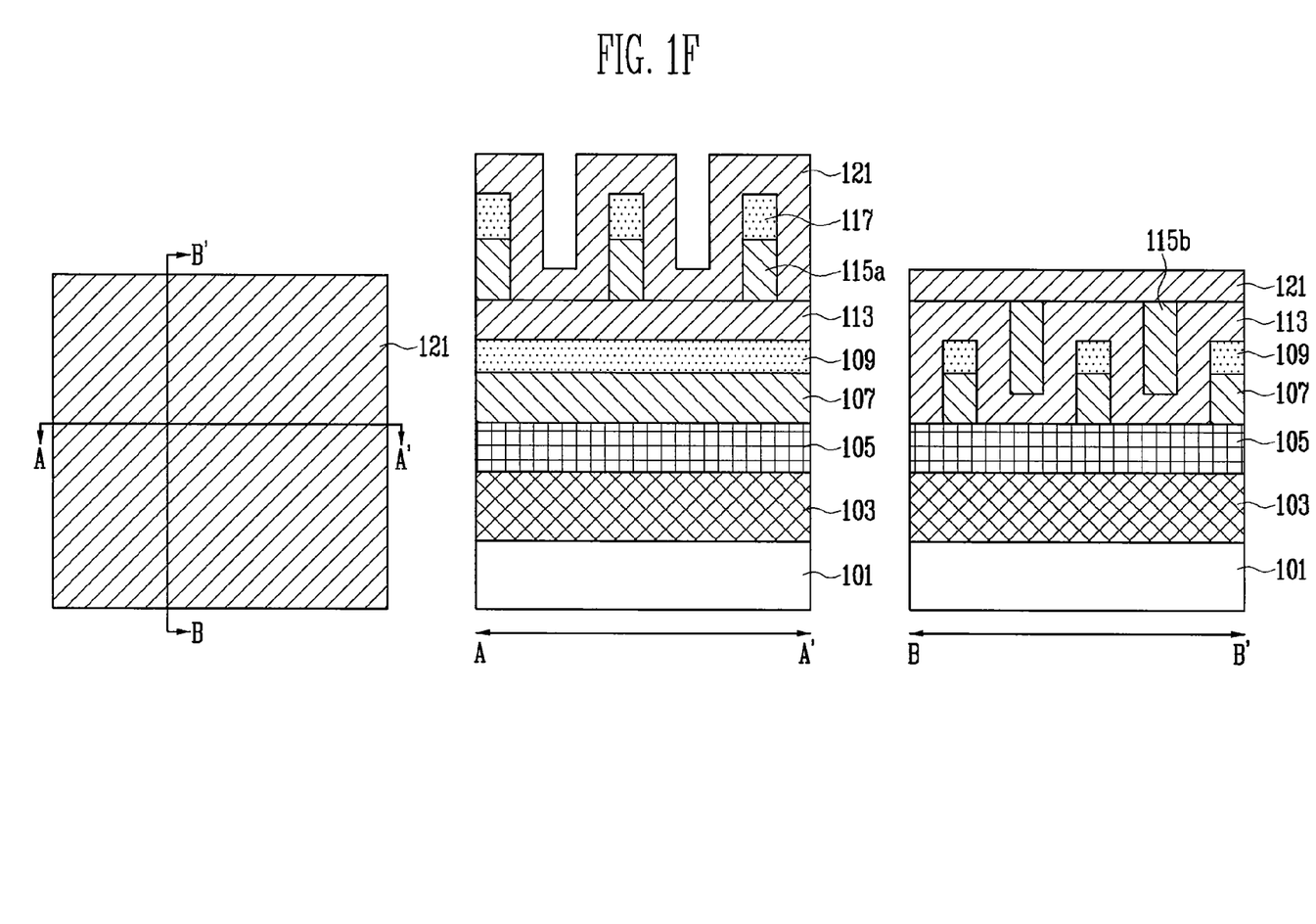

Referring to FIG. 1F, a second auxiliary layer 121 is formed over the patterned portion of the second anti-reflection layer 117 and the third hard mask patterns 115a, 115b. It is preferred that the second auxiliary layer 121 is formed of the same material as the first auxiliary layer 113, that is, carbon polymer.

The second auxiliary layer 121 is formed to a thickness that allows the step portions formed by the third hard mask patterns 115a, 115b to be substantially maintained. In particular, since the thickness of the second auxiliary layer 121, which is formed on the sidewalls of the first line portions 115a of the third hard mask patterns 115a, 115b, determines the width of the contact holes in the other direction in subsequent processes, it is preferred that the thickness of the second auxiliary layer 121 is adjusted depending upon the desired width of the contact holes in the other direction. As the second auxiliary layer 121 is formed to a thickness that allows the step portions to be maintained, step portions, such as trenches, having a width corresponding to the distance between the contact areas CA, are formed between the first line portions 115a of the third hard mask patterns 115a, 115b by the second auxiliary layer 121. In other words, the distance between the opposing sidewalls of the second auxiliary layer 121 corresponds to the distance between the contact holes.

The second line portions 115b of the third hard mask patterns 115a, 115b are also covered by the second auxiliary layer 121.

Figure 1G:
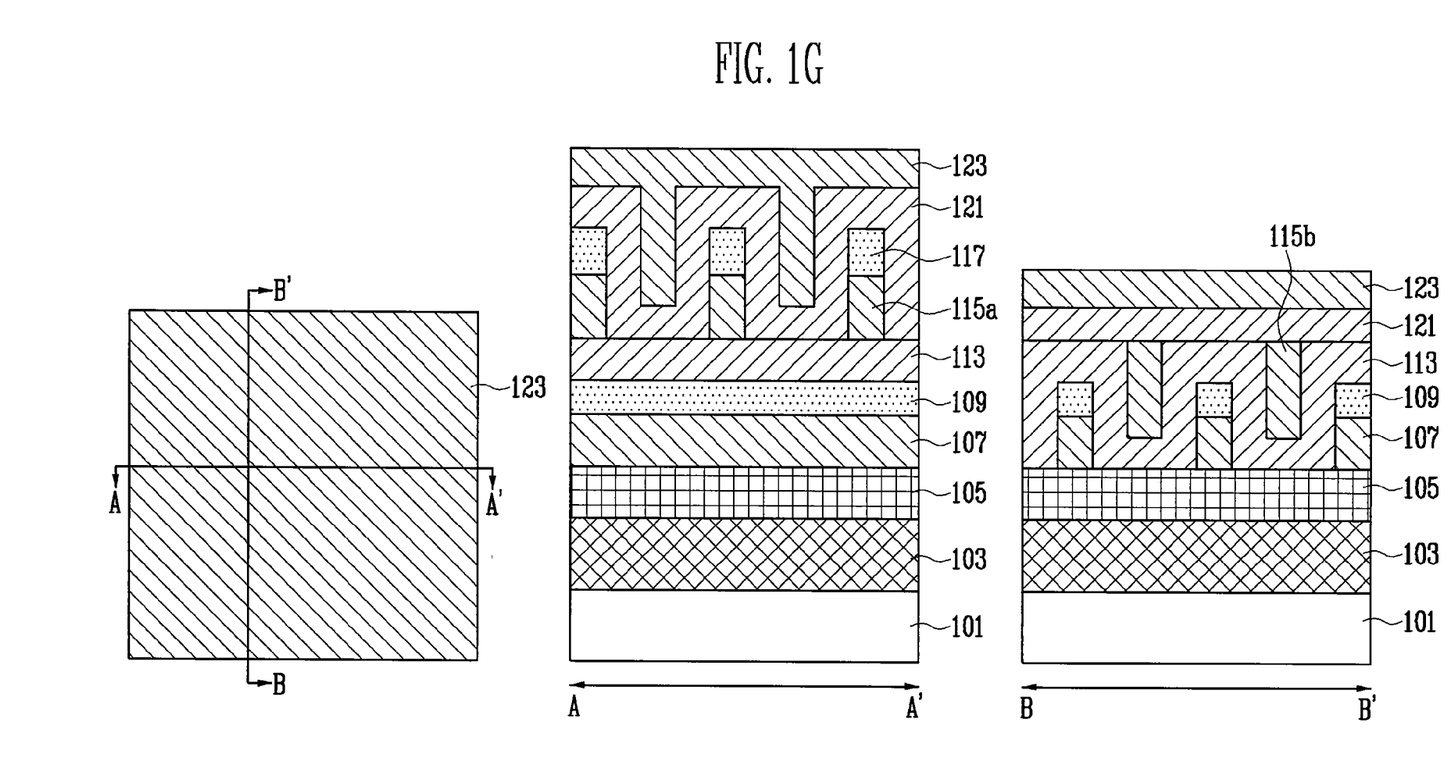

Referring to FIG. 1G, a fourth hard layer 123 is formed over the second auxiliary layer 121 such that the step portions defined in the second auxiliary layer 121 are completely filled with the fourth hard layer 123. It is preferred that the fourth hard layer 123 is formed of the same material as the third hard layer 115 or the second hard layer 107, that is, an Si-containing BARC layer, to ensure easy implementation of subsequent processes.

Figure 1H:
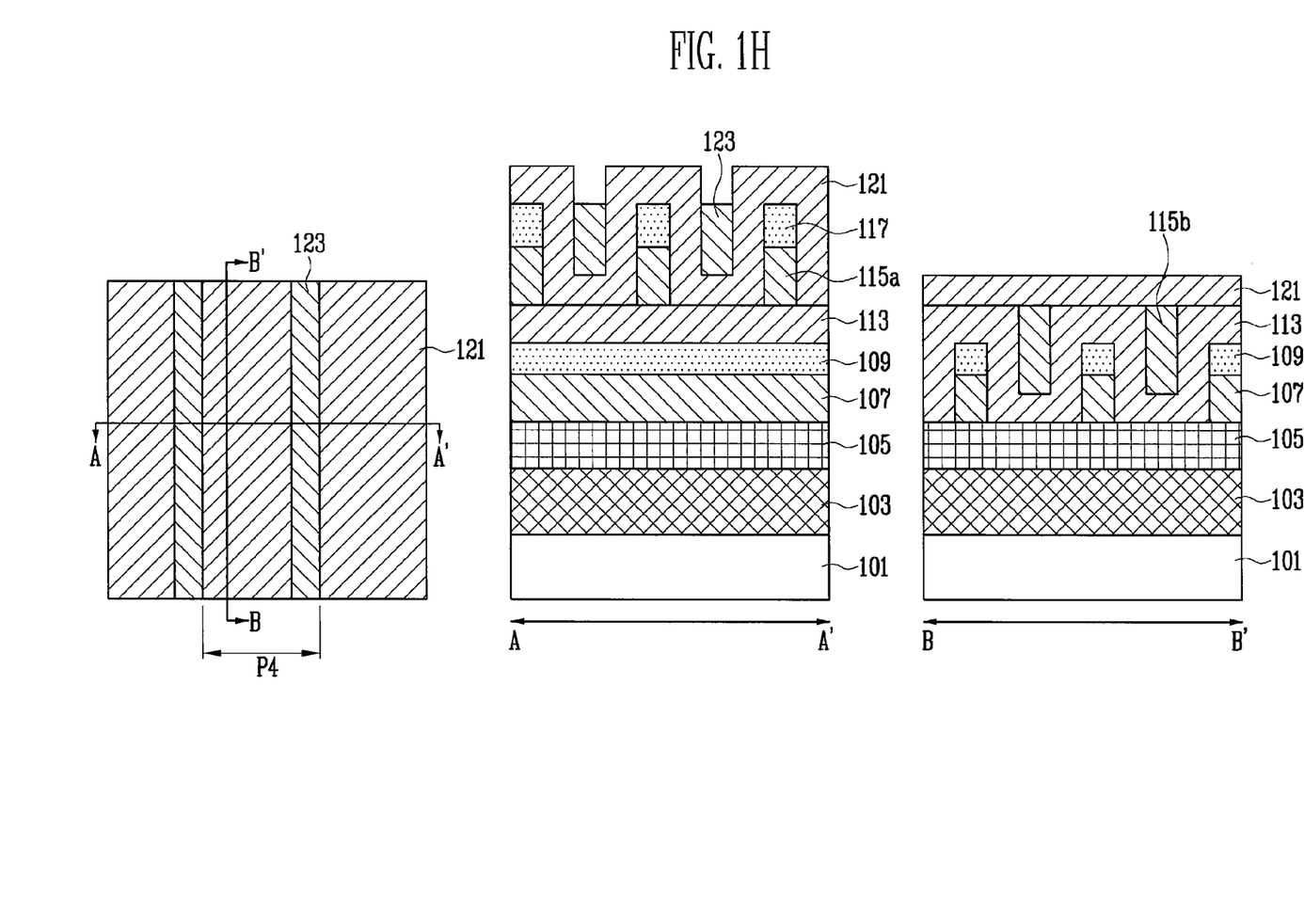

Referring to FIG. 1H, by implementing an etching process to allow the fourth hard layer 123 to remain only in the step portions formed in the second auxiliary layer 121, fourth hard mask patterns 123 are foamed. The distance between the fourth hard mask patterns 123 and the first line portions 115a is determined by the thickness of the second auxiliary layer 121.

The etching process can be implemented by conducting a chemical and mechanical polishing process until the second auxiliary layer 121 is exposed. Also, the etching process can be implemented by full-surface etching such as an etch-back process. The fourth hard mask patterns 123 are formed on the second auxiliary layer 121 between the first line portions 115a of the third hard mask patterns 115a, 115b to extend parallel to the first line portions 115a. The pitch P4 of the fourth hard mask patterns 123 is approximately two times the pitch P1 of the contact areas CA.

Since the fourth hard layer 123 remains only in the step portions formed in the second auxiliary layer 121, the fourth hard mask patterns 123 are arranged between the first line portions 115a. Accordingly, since it is not necessary to use a separate mask, an arrangement error does not occur. The distance between the first line portions first patterns 115a and the fourth hard mask patterns 123 is determined by the thickness of the second auxiliary layer 121.

Figure 1I:
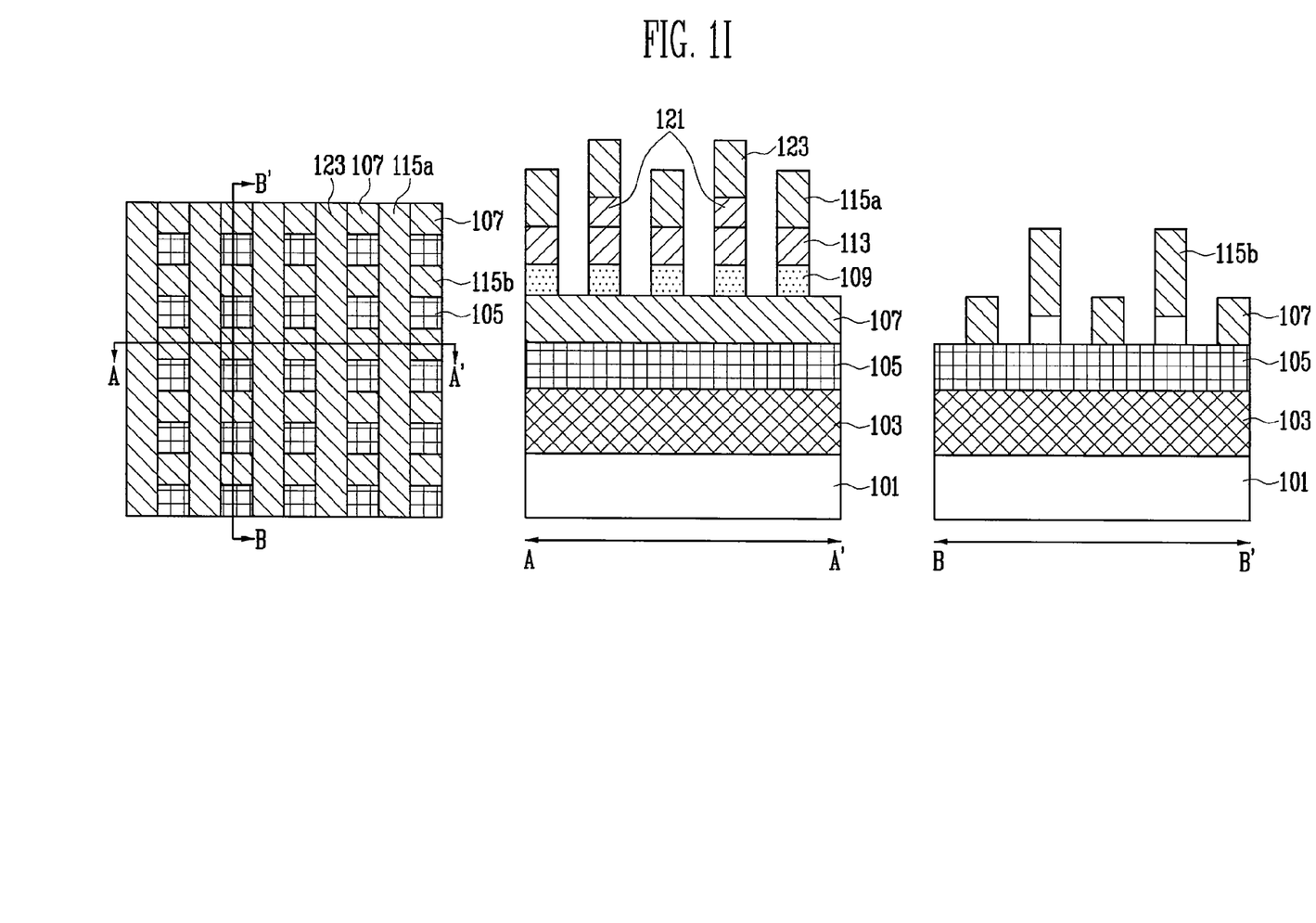

Referring to FIG. 1I, the first auxiliary layer 113 and the second auxiliary layer 121 are etched such that the first auxiliary layer 113 and the second auxiliary layer 121 remain over and under the second, third and fourth hard mask patterns 107, 115a, 115b, 123. Thus, the first hard layer 105 is exposed in the contact areas CA.

Figure 1J:
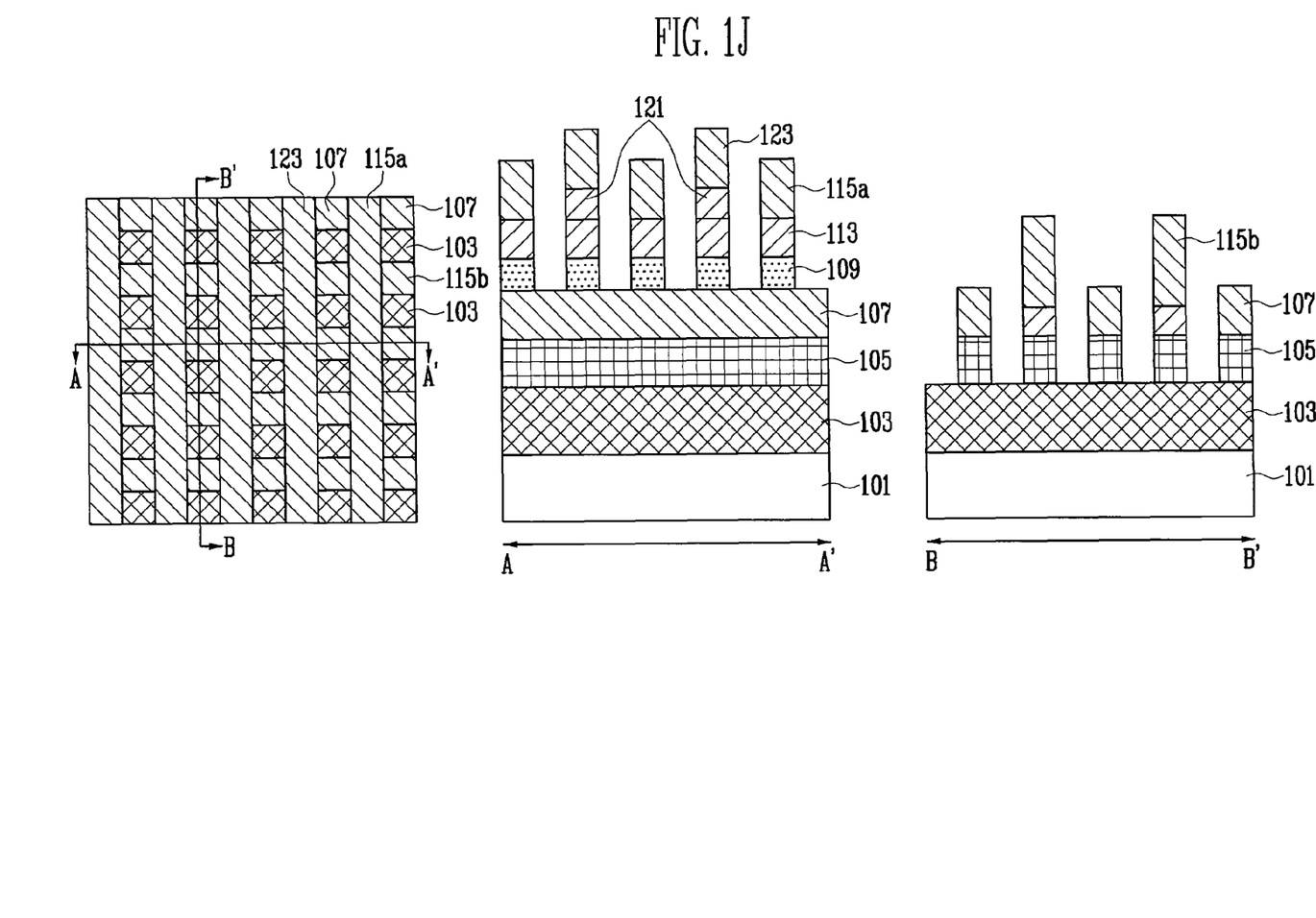

Referring to FIG. 1J, by patterning the first hard layer 105 through an etching process using the second, third and fourth hard mask patterns 107, 115a, 115b, 123, first hard mask patterns 105 having openings in the contact areas CA are formed. Then, while not shown in the drawings, by implementing an etching process using the first hard mask patterns 105, the lower layer 103 is etched. Thus, contact holes are defined in the lower layer 103 (for example, an interlayer dielectric). In the case of a 4F4 DRAM device, contact holes are defined at areas in which storage node contact plugs are to be formed. When viewed in their entirety, the contact holes are arranged in the shape of a matrix.

In the above description, the processes for forming and etching the auxiliary layers containing carbon polymer, the hard layers including Si-containing BARC layers, and the anti-reflection layers can be implemented in-situ in the same chamber such that the processes can be continuously implemented without interrupting a vacuum condition.

Although the case of forming the first hard layer 105 was described in the present embodiment, it can be envisaged that the first hard layer 105 can be omitted and the lower layer 103 can be patterned by an etching process using the second through fourth hard mask patterns 107, 115a, 115b, 123.

The shapes of the second, third and fourth hard mask patterns 107, 115a, 115b, 123, which are used as an etch mask for the lower layer 103, will be more clearly described below.

Figure 2:
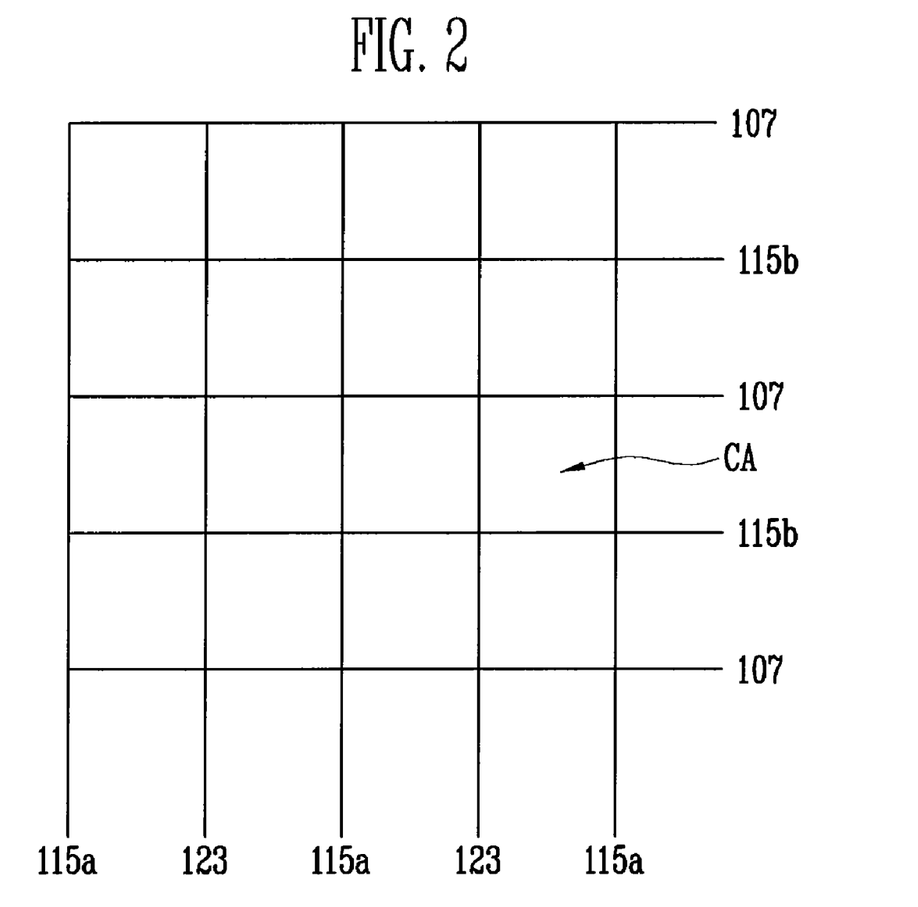
FIG. 2 is a view illustrating the shapes of the hard mask patterns formed in FIG. 1J.

Referring to FIG. 2, the second hard mask patterns 107 are formed to be parallel to one another in one direction, and the pitch of the second hard mask patterns 107 is approximately two times the pitch of the contact areas CA. The first line portions 115a of the third hard mask patterns 115a, 115b are formed in a direction that is substantially perpendicular to the second hard mask patterns 107, and the pitch of the first line portions 115a is approximately two times the pitch of the contact areas CA. The second line portions 115b of the third hard mask patterns 115a, 115b are formed between the second hard mask patterns 107 in a direction that is parallel to the second hard mask patterns 107, and the pitch of the second line portions 115b is approximately two times the pitch of the contact areas CA. The fourth hard mask patterns 123 are formed between the first line portions 115a of the third hard mask patterns 115a, 115b in a direction that is substantially perpendicular to the second hard mask patterns 107, and the pitch of the fourth hard mask patterns 123 is approximately two times the pitch of the contact areas CA.

The distance between the second hard mask pattern 107 and the second line portion 115b is determined by the thickness of the first auxiliary layer 113 (see FIG. 1E), and the distance between the fourth hard mask pattern 123 and the first line portion 115a is determined by the thickness of the second auxiliary layer 121 (see FIG. 1H). Accordingly, if the thicknesses of the first auxiliary layer 113 and the second auxiliary layer 121 are substantially the same, the distances between the second through fourth hard mask patterns 107, 115a, 115b, 123 become substantially the same. This means that the transverse width and the longitudinal width of the contact holes are determined by the thicknesses of the first auxiliary layer 113 and the second auxiliary layer 121. Therefore, if the thicknesses of the first auxiliary layer 113 and the second auxiliary layer 121 are substantially the same, square contact holes are defined.

The first and second photoresist patterns 111, 119, which are used to form the hard mask patterns 107, 115a, 115b, 123, are respectively formed through first and second photolithographic processes using first and second photolithographic masks which are respectively defined in the types of longitudinal lines and transverse lines. The pitches of the patterns are defined on the photolithographic masks in opaque or transparent patterns. In this case, even when an arrangement error occurs, an error does not occur in the pitches of the mask patterns. For this reason, even when an arrangement error occurs in the longitudinal or transverse direction, the size of the contact holes does not change. As a result, the problems resulting from the arrangement error can be solved.

By forming the hard mask patterns 107, 115a, 115b, 123 as the transparent Si-containing BARC layers, key mask opening processes for exposing overlay verniers used in the arrangement of masks can be omitted. In other words, process steps can be simplified. Moreover, because the Si-containing BARC layers are formed through spin-on processes, advantages are provided in that the third and fourth hard mask patterns 115a, 115b, 123 can be easily formed between the spaces defined in the first and second auxiliary layers 113, 121. In particular, since the spin-on processes are implemented at a low temperature (for example, room temperature) when compared to chemical vapor deposition (CVD) or physical vapor deposition (PVD), in the course of forming the hard mask patterns, it is possible to minimize thermal burdens applied to the previously formed lower elements.

In the case that the hard mask patterns 107, 115a, 115b, 123 are formed as the Si-containing BARC layers and the auxiliary layers 113, 121 are formed of carbon polymer, these patterns and layers contain carbon. If the auxiliary layers 113, 121 are removed through an $O_2$ plasma etching process, as $O_2$ reacts with Si, $SiO_2$ is formed to serve as an etch barrier. Therefore, the etching selectivities of the hard mask patterns and the auxiliary layers can be increased.

In the conventional art, in order to define areas in which contact holes are to be formed in the shape of a matrix, photolithographic processes are implemented using a first mask for defining the contact holes to be positioned in odd-numbered rows and odd-numbered columns and a second mask for defining contact holes to be positioned in even-numbered rows and even-numbered columns. Thus, since two masks are used, an arrangement error may result. However, in the present invention, since contact holes are defined by implementing patterning processes in longitudinal and transverse directions, an arrangement error does not occur.

Further, in order to realize a contact array in a DRAM using a conventional dual exposure and etch technology (DEET), masks must be divided into two pieces as in the shape of a checker board. In order to define the checker board type contact array using exposure equipment, since a two-dimensionally symmetrical illumination system must be adopted, resolution is decreased. Thus, a k1 factor that can be obtained through DEET increases above 0.20. However, in the present invention, since line types are defined using exposure equipment, a k1 factor can be obtained up to 0.14 by adopting a powerful illumination system such as a dipole.

Although a specific embodiment of the present invention has been described for illustrative purposes, those skilled in the art will appreciate that various modifications, additions and substitutions are possible, without departing from the scope and the spirit of the invention as disclosed in the accompanying claims.

What is claimed is:

1. A method for forming hard mask patterns of a semiconductor device, the method comprising:
   forming a first layer over a semiconductor substrate;
   patterning the first layer, thereby forming first hard mask patterns each of which has a line shape, wherein a space is defined between the first hard mask patterns;
   forming a first auxiliary layer along surface of a resulting structure after forming the first hard mask patterns;
   forming a second layer over the first auxiliary layer;
   forming photoresist patterns each of which has a line shape over the second layer, wherein the photoresist patterns are perpendicular to the first hard mask patterns;
   removing the second layer exposed by the photoresist patterns to expose the first auxiliary layer and such that the second layer remains within the space between the first hard mask patterns, thereby forming a second hard mask pattern having first line portions perpendicular to the first hard mask patterns and second line portions which are positioned between the first hard mask patterns and are parallel to the first hard mask patterns, wherein a space is defined between the first line portions;
   removing the photoresist patterns;
   forming a second auxiliary layer along surface of a resulting structure after removing the photoresist patterns;

forming a third layer over the second auxiliary layer;

removing the third layer to expose the second auxiliary layer such that the third layer remains within the space between the first line portions, thereby forming third hard mask patterns parallel to the first line portions, wherein a space is defined between the third hard mask patterns; and removing the first and second auxiliary layers exposed by an overlap of the space between the third hard mask patterns and the space between the first line portions, thereby exposing contact areas arranged in a two-dimensional pattern.

2. The method according to claim 1, further comprising:
before forming the first layer, forming a lower layer over the semiconductor substrate.

3. The method according to claim 1, wherein the first layer comprises a spin-on coating (SOC) layer.

4. The method according to claim 1, wherein the first layer comprises a Si-containing bottom antireflective coating (BARC) layer.

5. The method according to claim 1, wherein the first auxiliary layer comprises carbon polymer.

6. The method according to claim 1, further comprising:
forming an anti-reflection layer over the second layer.

7. The method according to claim 1, wherein a distance between the first hard mask pattern and the second line portion of the second hard mask pattern is determined by a thickness of the first auxiliary layer.

8. The method according to claim 1, wherein the second layer comprises a Si-containing BARC layer.

9. The method according to claim 1, wherein the second auxiliary layer comprises carbon polymer.

10. The method according to claim 1, wherein a distance between the first line portion of the second hard mask pattern and the third hard mask pattern is determined by a thickness of the second auxiliary layer.

11. The method according to claim 1, wherein the third layer comprises a Si-containing BARC layer.

12. The method according to claim 1, wherein the first, second and third hard mask patterns comprise the same material.

13. The method according to claim 1, wherein the first, second and third hard mask patterns are formed on different layers from one another.

14. The method according to claim 1, wherein spaces formed by the first, second and third hard mask patterns are the contact areas in which contact holes are to be formed.

15. The method according to claim 1, wherein a pitch of the first hard mask patterns is two times a pitch of the contact areas.

16. The method according to claim 1, wherein a pitch of the first line portions is two times a pitch of the contact areas.

17. The method according to claim 1, wherein a pitch of the second line portions is two times a pitch of the contact areas.

18. The method according to claim 1, wherein a pitch of the third hard mask patterns is two times a pitch of the contact areas.

19. Hard mask patterns of a semiconductor device, comprising:
first hard mask patterns formed over a semiconductor substrate, wherein each of the first hard mask patterns has a line shape, wherein a space is defined between the first hard mask patterns;

a second hard mask pattern patterns including first line portions perpendicular to the first hard mask patterns and second line portions which are positioned between the first hard mask patterns and are parallel to the first hard mask patterns, wherein a space is defined between the first line portions; and third hard mask patterns that are positioned between the first line portions and are parallel to the first line portions, wherein a space is defined between the third hard mask patterns, wherein contact areas arranged in a two-dimensional pattern are exposed by the first, second and third hard mask patterns.

20. The hard mask patterns according to claim 19, wherein the first through third hard mask patterns comprise the same material.

21. The hard mask patterns according to claim 20, wherein the first line portions and the second line portions of the second hard mask pattern are formed on different layers from each other.

22. The hard mask patterns according to claim 21, wherein, among the first, second and third hard mask patterns, the first hard mask patterns correspond to a lowermost layer, the second line portions of the second hard mask pattern correspond to a layer higher than the first hard mask patterns, the first line portions of the second hard mask pattern correspond to a layer higher than the second line portions of the second hard mask pattern, and the third hard mask patterns correspond to an upper layer higher than the first line portions of the second hard mask pattern.

23. The hard mask patterns according to claim 19, wherein the first, second and third hard mask patterns comprise Si-containing BARC layers.

24. The hard mask patterns according to claim 19, wherein a lower layer and a hard layer are formed over the semiconductor substrate.

25. The hard mask patterns according to claim 24, wherein the hard layer comprises an SOC layer.

26. The hard mask patterns according to claim 19, wherein the first, second and third hard mask patterns are formed on different layers from one another.

27. The hard mask patterns according to claim 19, wherein a distance between the second line portion of the second hard mask pattern and the first hard mask pattern corresponds to a transverse width of contact holes, and a distance between the first line portion of the second hard mask pattern and the third hard mask pattern corresponds to a longitudinal width of the contact holes.

28. The hard mask patterns according to claim 27, wherein distances between the first, second and third hard mask patterns are the same.

* * * * *